US012464725B2

(12) United States Patent
Wu et al.

(10) Patent No.: US 12,464,725 B2
(45) Date of Patent: Nov. 4, 2025

(54) 3D CIRCUIT STRUCTURE WITH STAIRSTEP CONTACT CONFIGURATION

(71) Applicant: MACRONIX INTERNATIONAL CO., LTD., Hsinchu (TW)

(72) Inventors: Meng-Yen Wu, Taichung (TW); Teng-Hao Yeh, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 590 days.

(21) Appl. No.: 17/706,232

(22) Filed: Mar. 28, 2022

(65) Prior Publication Data

US 2023/0109723 A1    Apr. 13, 2023

Related U.S. Application Data

(60) Provisional application No. 63/254,893, filed on Oct. 12, 2021.

(51) Int. Cl.
*H10B 43/40* (2023.01)
*G11C 16/04* (2006.01)
(Continued)

(52) U.S. Cl.
CPC ......... *H10B 43/40* (2023.02); *G11C 16/0483* (2013.01); *H01L 23/5226* (2013.01);
(Continued)

(58) Field of Classification Search
CPC .. H10B 12/0383; H10B 12/395; H10B 20/30; H10B 41/41; H10B 41/43; H10B 41/49;
(Continued)

(56) References Cited

U.S. PATENT DOCUMENTS 9,922,716 B2    3/2018  Hsiung et al.
10,522,228 B2   12/2019 Tanaka
(Continued)

FOREIGN PATENT DOCUMENTS

JP    2018157103 A    10/2018
JP    2021082827 A     5/2021
(Continued)

*Primary Examiner* — Moin M Rahman
(74) *Attorney, Agent, or Firm* — Andrew L. Dunlap; Haynes Beffel & Wolfeld LLP

(57) ABSTRACT

Circuit structures to improve manufacturing yield in complex 3D circuits have a first stack of conductors and a second stack of conductors having memory regions and contact regions. Conductors of the first stack have stepped arrangement in the contact region to provide landing areas on the conductors. Connecting circuits connect the landing areas of conductive layers in the first stack to through-stack conductors in vias in the second stack, to connect to circuitry below the stack. The memory regions include arrays of vertical memory pillars. The connecting circuits include interlayer connectors contacting landing areas in the first stack, extending to patterned conductors over the first and second stacks. The patterned conductors can include links from interlayer connectors of the first stack to through-stack connectors of the second stack. The circuit structure can include a plurality of structural vertical pillars in the contact region of the first stack.

19 Claims, 9 Drawing Sheets

(51) Int. Cl.
  *H01L 23/522* (2006.01)
  *H10B 41/10* (2023.01)
  *H10B 41/27* (2023.01)
  *H10B 41/35* (2023.01)
  *H10B 41/40* (2023.01)
  *H10B 43/10* (2023.01)
  *H10B 43/27* (2023.01)
  *H10B 43/35* (2023.01)

(52) U.S. Cl.
  CPC ............ *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02)

(58) Field of Classification Search
  CPC ...... H10B 61/22; H10B 63/34; H10B 12/053; H10B 12/056; H10B 12/05; H10B 12/36; H10B 10/12; H10B 20/40–65; H10B 53/20; H10B 41/20–27; H10B 43/20–27; H10B 51/20; H10B 63/84–845; H10D 88/00; H10D 88/101; H10D 84/983–988; H10D 88/01; H10D 62/121; H10D 30/024; H10D 30/62; H10D 30/6735; H10D 30/794; H10D 30/797; H10D 62/115; H10D 62/151; H10D 62/292; H10D 62/822; H10D 64/017; H10D 64/021; H10D 64/257; H10D 64/62; H10D 30/014; H10D 30/0323; H10D 30/43; H10D 30/6744; H10D 30/6757; H10D 64/251; H10D 62/116; H10D 62/364; H01L 21/02532; H01L 21/02603; H01L 21/28568; H01L 21/30604; H01L 25/105; H01L 21/30625; H01L 21/6835
  See application file for complete search history.

(56) References Cited

U.S. PATENT DOCUMENTS

| | | |
|---|---|---|
| 10,636,812 B1 * | 4/2020 | Lai ...................... G11C 11/5628 |
| 10,644,018 B2 | 5/2020 | Lee et al. |
| 10,700,004 B2 | 6/2020 | Chen |
| 2014/0054789 A1 * | 2/2014 | Chiu ...................... H01L 23/522 257/774 |
| 2016/0233229 A1 | 8/2016 | Oh et al. |
| 2017/0179153 A1 | 6/2017 | Ogawa et al. |
| 2017/0352678 A1 | 12/2017 | Lu et al. |
| 2018/0047807 A1 | 2/2018 | Ho et al. |
| 2019/0148393 A1 | 5/2019 | Lue |
| 2019/0237475 A1 | 8/2019 | Jung et al. |
| 2019/0280002 A1 | 9/2019 | Kai et al. |
| 2020/0266211 A1 | 8/2020 | Tao et al. |
| 2020/0328224 A1 | 10/2020 | Lai et al. |
| 2020/0343252 A1 | 10/2020 | Lai et al. |
| 2021/0242228 A1 | 8/2021 | Hu et al. |

FOREIGN PATENT DOCUMENTS

| | | |
|---|---|---|
| WO | 2017091338 A1 | 6/2017 |
| WO | 2021025748 A1 | 2/2021 |

* cited by examiner

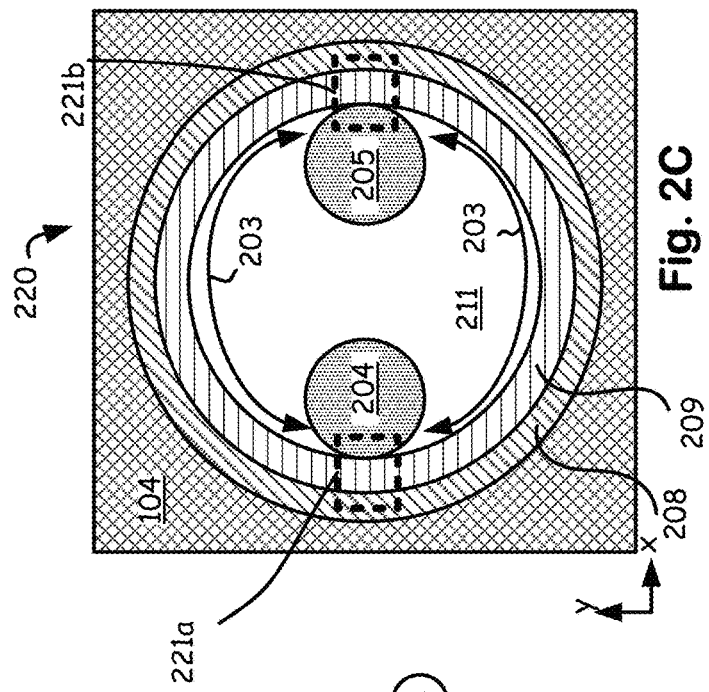
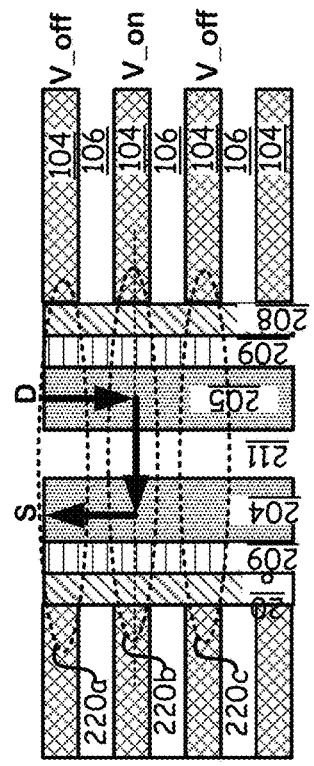
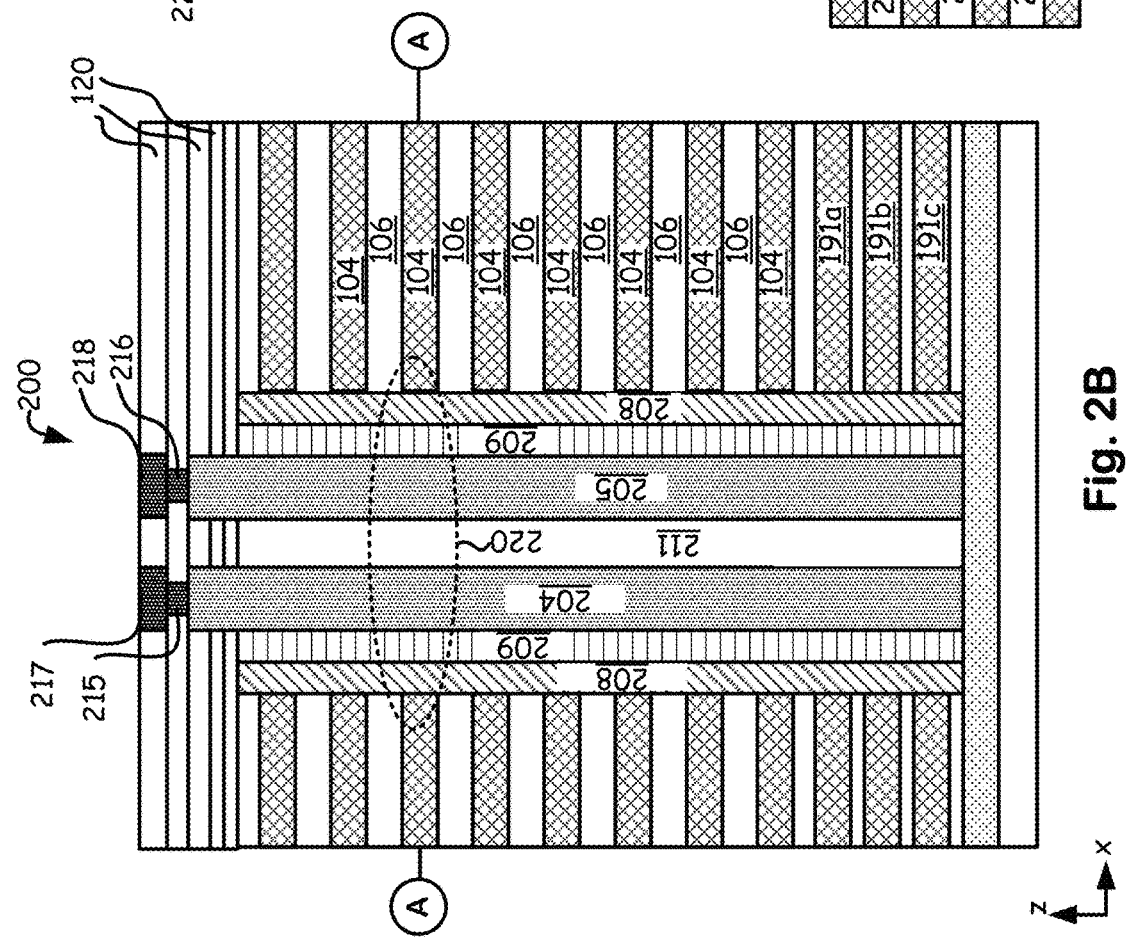
Fig. 2C
Fig. 2C1
Fig. 2B

3D CIRCUIT STRUCTURE WITH STAIRSTEP CONTACT CONFIGURATION

PRIORITY APPLICATION

This application claims the benefit of U.S. Provisional Patent Application No. 63/254,893 filed 12 Oct. 2021, which application is incorporated herein by reference.

BACKGROUND

Field

A technology is presented related to circuit structures for interconnection of stacked conductors, such as word lines in a 3D memory, with other circuitry having a stepped contact configuration.

Description of Related Art

Integrated circuits are being manufactured using stacks of conductors to achieve higher density and interconnectivity. In 3D memory, for example, circuit structures are being developed that have stacks of word lines including dozens of layers, and in some cases more than 100 layers.

The stacked circuit structures can be delicate, particularly during certain stages of manufacturing. For example, one approach to manufacturing 3D structures involves formation of stacks of insulating layers and sacrificial layers, followed by etching the stacks to shape circuit structures, and adding active elements to the circuit structures, while the sacrificial layers remain. At some stage in the manufacturing, sacrificial layers are removed and replaced with a conductive material. In some types of 3D memory, the conductive material used to replace the sacrificial layers can be configured as word lines that act as gates for memory cells in the 3D memory array being formed. Thus, this procedure is sometimes referred to as a gate replacement technique. During the stage in which the sacrificial layers are removed and replaced, the circuit structure is quite fragile which can affect the manufacturing yield.

Also, critical dimensions of these types of stacked circuit structures continue to shrink, affecting the etching and layout margins for structures being built.

It is desirable provide technology that can improve the etching and layout margins in stacked circuit structures. Also, it is desirable to provide technology to improve the manufacturing yield in stacked circuit structures.

SUMMARY

Technologies are presented including circuit structures which can improve manufacturing yield in complex 3D circuits. A circuit structure described comprises a first stack of conductors having an operative region and a contact region, conductors of the first stack having a stepped arrangement in the contact region to provide respective landing areas on the conductors, a second stack of conductors separated from the first stack, the second stack having an operative region and a contact region adjacent the contact region of the first stack, and connecting circuits that connect the landing areas of conductive layers in the first stack to through-stack conductors in vias in the contact area of the second stack, the through-stack conductors connecting to circuitry below the stack.

A circuit structure can be implemented including a first array of vertical pillars through the operative region (e.g. memory region including memory cells) of the first stack, and a second array of vertical pillars through the operative region of the second stack. The connecting circuits can include a plurality of interlayer connectors in the contact region of the first stack, the interlayer connectors in the plurality of interlayer connectors contacting respective landing areas on conductors in the first stack, and extending to patterned conductors over the first and second stacks. Also, the patterned conductors can include links from interlayer connectors in the plurality of interlayer connectors in the contact region of the first stack to through-stack connectors in the contact region of the second stack.

A circuit structure can be implemented including a plurality of structural vertical pillars in the contact region of the first stack.

The structural vertical pillars in the plurality of structural vertical pillars can be disposed in vias having a first layout area, and the through-stack conductors in the plurality of through-stack conductors can be disposed in vias having a second layout area, the second layout area being larger than the first layout area. In an example, a circuit structure can include two structural vertical pillars in respective vias through the stack in the landing area of a particular conductor in the first stack.

A circuit structure can include, in an example combination of features, a first stack of conductors having an operative region and a contact region, conductors of the first stack having a stepped arrangement in the contact region to provide respective landing areas on the conductors; a second stack of conductors separated from the first stack, the second stack having an operative region and a contact region adjacent the contact region of the first stack; a first array of vertical pillars through the operative region of the first stack and a second array of vertical pillars through the operative region of the second stack, the vertical pillars in the first and second arrays comprising memory structures in first vias having a first layout area; a plurality of interlayer connectors in the contact region of the first stack, the interlayer connectors in the plurality of interlayer connectors contacting respective landing areas on conductors in the first stack, and extending to patterned conductors over the first and second stacks; and a plurality of through-stack conductors in the contact region of the second stack, the through-stack conductors extending from the patterned conductors over the first and second stacks to a circuit under the second stack. The patterned conductors in this example combination include links from interlayer connectors in the plurality of interlayer connectors in the contact region of the first stack to through-stack connectors in the plurality of through-stack conductors in the contact region of the second stack.

In a two-outlet configuration, this example combination can be expanded so the second stack has a second contact region on a second side of the operative region of the second stack, conductors of the second stack having a stepped arrangement in the second contact region to provide respective landing areas on the conductors; and the first stack has a second contact region on a second side of the operative region of the first stack, the second contact region of the first stack adjacent the second contact region of the second stack; a second plurality of interlayer connectors in the second contact region of the second stack, the interlayer connectors in the second plurality of interlayer connectors contacting respective landing areas on conductors in the second stack, and extending to patterned conductors over the first and second stacks; and a plurality of through-stack conductors in the second contact region of the first stack, the through-stack conductors extending from the patterned conductors over the first and second stacks to a circuit under the first stack. The patterned conductors include links from interlayer connectors in the plurality of interlayer connectors in the second contact region of the second stack to through-stack connectors in the plurality of through-stack conductors in the contact region of the first stack.

Other aspects and advantages of the technology presented can be seen on review of the drawings, the detailed description and the claims, which follow.

BRIEF DESCRIPTION OF THE DRAWINGS

FIGS. 2B and 2C illustrate memory pillar and cell structures for a circuit structure like that of FIG. 2A.

FIG. 2C1 illustrates operation of a memory cell like that of FIGS. 2B and 2C.

DETAILED DESCRIPTION

A detailed description of embodiments of the technology presented is provided with reference to the FIGS. 1-7.

Figure 1:
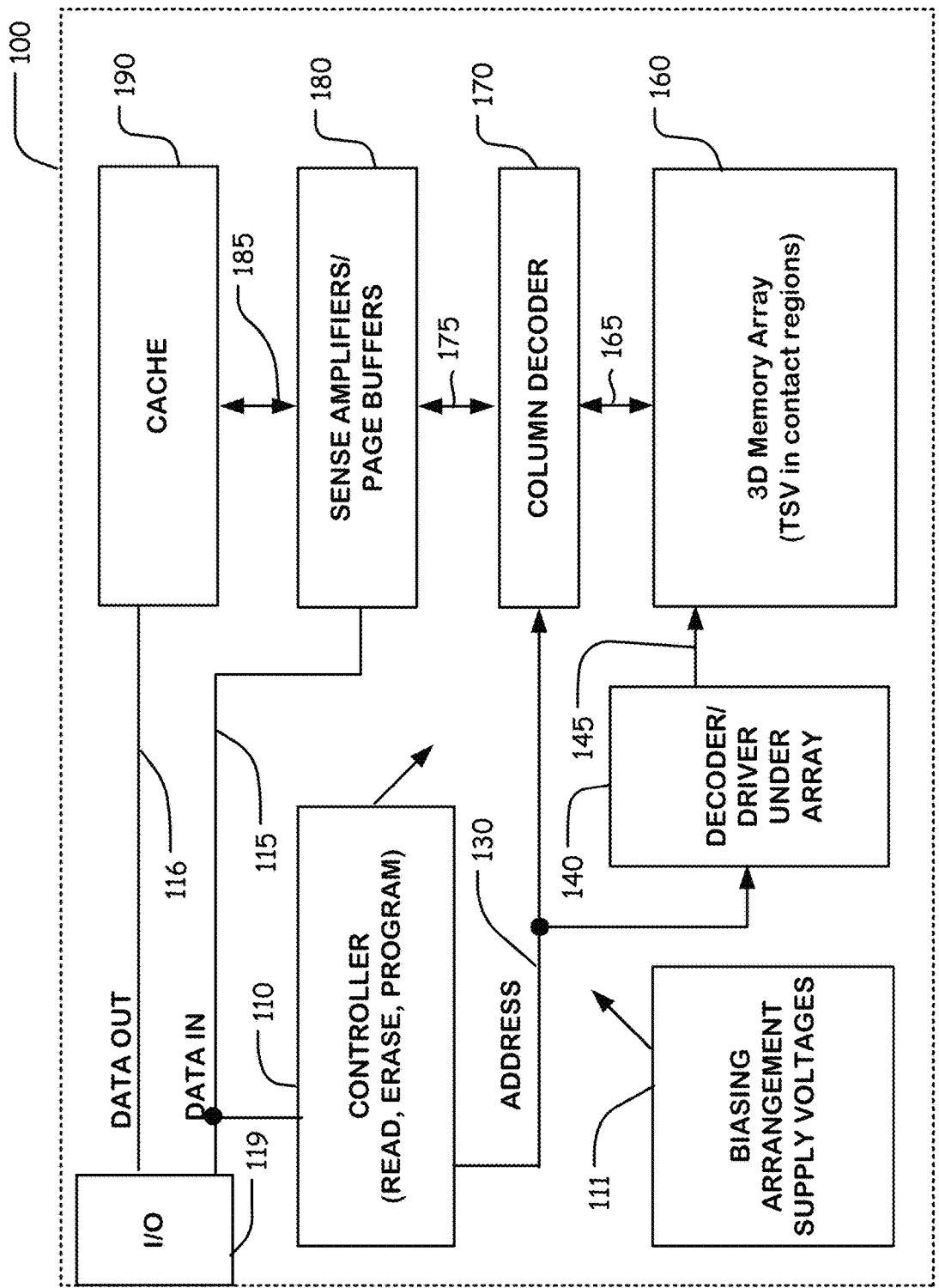
FIG. 1 is a simplified block diagram of an integrated circuit memory device, including through-stack vias (TSVs) in contact regions of the memory array for connection to circuits under the stack.

FIG. 1 is a simplified block diagram of an integrated circuit memory device 100 including a 3D memory array 160. Although the technology can be applied in a variety of types of memory arrays, examples described herein include 3D flash memory configured in a NOR or AND architecture. The memory device 100 includes peripheral circuitry supporting the 3D memory array 160. The peripheral circuitry includes a controller 110 including logic circuits, such as state machines and the like, used for execution of operations necessary for the device, including in some examples command decoding, read, erase and program operations, input/output operations, address generation, memory management and so on. The peripheral circuitry includes biasing arrangement supply voltages circuit 111 which generates and distributes bias voltages and supply voltages throughout the integrated circuit for use in the memory operations and otherwise. Also, an input/output I/O interface 119 receives input data from off-chip and transmits the input data on line 115 to on-chip resources, and receives output data from on-chip resources on line 116, and transmits the output data off-chip.

In this example, addresses are provided by the controller 110 on line 130 distributed to a column decoder 170 which is coupled to data lines 165 from the 3D memory array 160 and to a decoder/driver 140 for rows in the 3D memory array 160 which is coupled to word lines 145 in this example. The column decoder 170 is coupled to sense amplifiers and page buffers 180 by line 175. Sense amplifiers and page buffers 180 are coupled by line 185 to a cache 190 in this example. The cache 190 is coupled to the data-out line 116.

In the technology described herein, at least some of the peripheral circuitry is implemented under the 3D memory array 160. This can be accomplished using, for example, CMOS under array circuit structures. In this block diagram, the decoder/driver 140 is implemented under the array. The 3D memory array 160 comprises a memory structure including a plurality of stacks of conductors which are configured in the examples described below as word lines. For connection to the circuitry under the 3D memory array 160, a plurality of through-stack vias TSVs are implemented in contact regions of the memory structure.

FIGS. 2A to 2D illustrate a 3D memory structure suitable for an AND architecture flash memory device which can be implemented as described above with reference to FIG. 1.

Figure 2A:
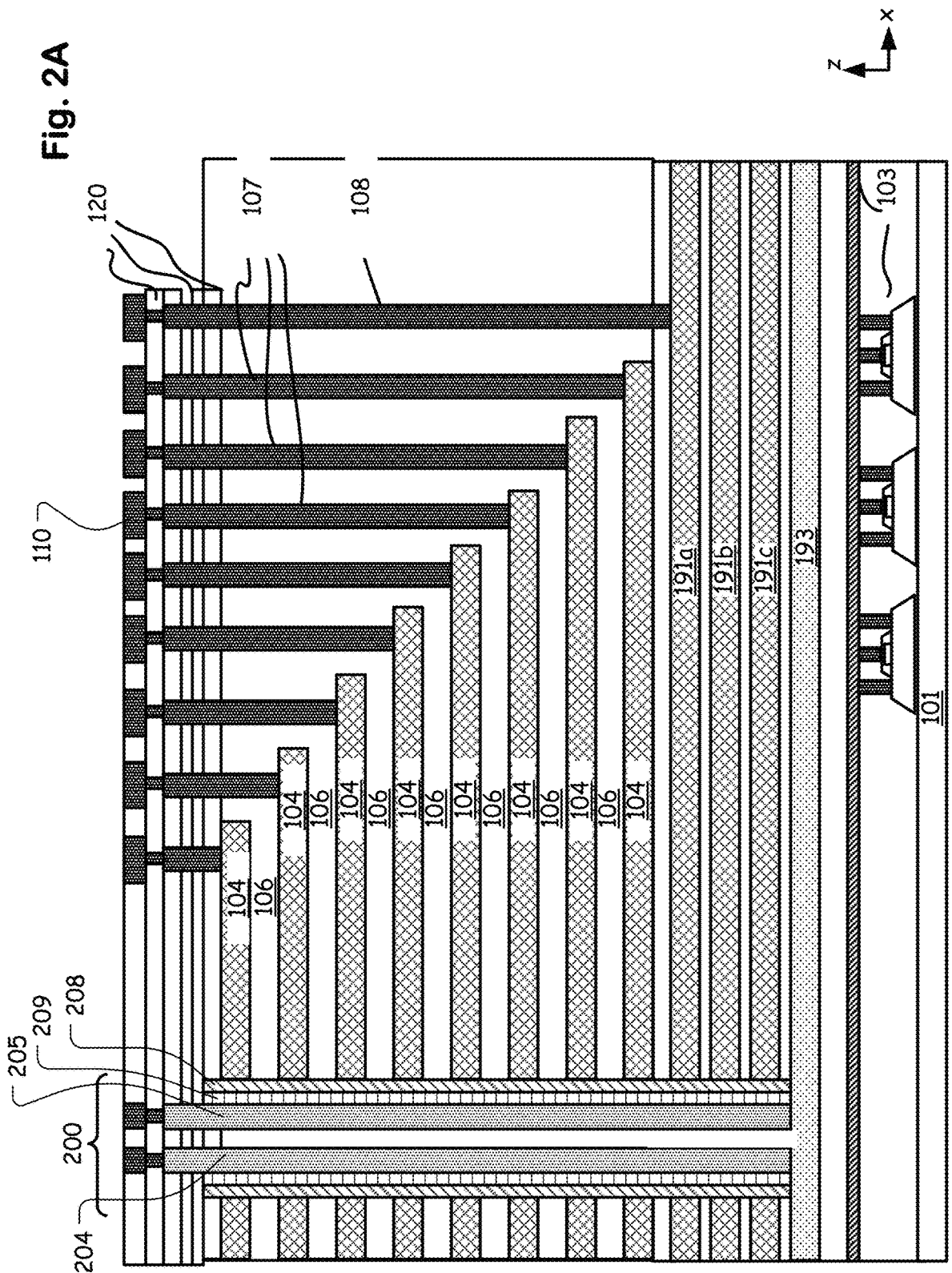
FIG. 2A is an illustration of a view of a circuit structure including a stack of conductors usable in a memory device like that of FIG. 1.

FIG. 2A is a cross-section of a circuit structure including a stack of conductors configured as word lines. The stack of conductors includes a memory region in which memory pillars (e.g. 200) are disposed through the stack. In this example, memory pillar 200 includes a data storage structure 208, channel layer 209, and a core including a first vertical conductor 204 configured as a source/drain line, a second vertical conductor 205 configured as a source/drain line and a dielectric fill isolating the first and second vertical conductors.

The stack of conductors is implemented in a circuit structure that includes alternating insulating layers 106 and word line layers 104. The alternating insulating layers 106 and word line layers 104 form a stack of conductors which is formed over a plurality of additional conductor layers 191a, 191b, 191c which can be used for a variety of functions in support of the memory array, including delivery of bias voltages, select transistor gates and so on.

A plurality of dielectric layers 120 are disposed over the stack of alternating insulating layers 106 and word line layers 104. At least upper sections of the vertical conductors 204, 205 extend through at least some of the dielectric layers 120. Overlying patterned conductors are used for global bit lines, source lines and other circuits supporting operation of the memory.

The dielectric layer 193 is disposed under the stack, and on top of the circuitry under the array.

The stack of conductors is configured in a stepped fashion in the contact region, forming landing areas on each word line layer in the stack at which contact can be made using vertical conductors (e.g. 107) which extend from the landing area of the corresponding conductor to patterned conductors 110 overlying the array. Also, as illustrated, a vertical conductor 108 can connect to the underlying conductor layers (e.g. 191a) to the overlying patterned conductor layers. The patterned conductors 110 extend to peripheral circuitry which can be disposed under the stack as described in examples herein.

The circuit structure as schematically illustrated includes under array circuitry 103 on the substrate 101, including transistors and a patterned conductor layer or layers, which can provide at least some parts of the peripheral circuitry for the array.

Referring now to FIGS. 2B and 2C, structure of the memory pillar 200 is described. As mentioned above, structures disposed in the via used for formation of the memory pillar 200 include a first vertical conductor 204 inside and on a first side of the vertical opening of the pillar 200, and a second vertical conductor 205 inside and on a second side of the vertical opening of the pillar 200. The first and second vertical conductors 204, 205 extend from a top of the vertical opening of the pillar 200 to a bottom of the vertical opening of the pillar 200, and are separated from each other by an insulating filling layer 211. Contact plugs 215 and 216 connect the vertical conductors 204 and 205 to overlying bit line and source line conductors 217 and 218.

As illustrated in FIGS. 2B and 2C, structures disposed in the vertical opening in pillar 200 include a data storage structure 208, such as a dielectric charge storage structure implemented using so-called SONOS, BE-SONOS and related technologies. The data storage structure 208 extends in the Z-direction within the vertical opening of the pillar 200. The data storage structure 208 can include a multilayer dielectric having a tunneling layer, a charge trapping layer, and a blocking layer. The tunneling layer can comprise a silicon oxide, or a silicon oxide/silicon nitride combination (e.g., Oxide/Nitride/Oxide or ONO). The charge trapping layer can comprise silicon nitride or other materials capable of trapping charges. The blocking layer can comprise silicon oxide, aluminum oxide, and/or combinations of such materials. The data storage structure 208 (the tunneling layer/the charge trapping layer/the blocking layer), as discussed above, may have any different combination of materials. In some examples, the data storage structure 208 may be implemented using a floating gate having a polysilicon charge trapping layer.

A memory cell 220 of the AND memory structure 102 is described. The memory cell 220 is disposed at an intersection (cross-point) of the vertical opening in the pillar 200 and the word line layer 104. FIG. 2C shows the memory cell 220 in a cross-section taken at line A-A of FIG. 2B. The memory cell 220 includes the word line layer 104 surrounding the data storage structure 208, a channel layer 209, the first vertical conductor 204, and the second vertical conductor 205. An insulating filling layer 211 is filled in a gap surrounded by the channel layer 209 and not occupied by the first vertical conductor 204, the second vertical conductor 205.

As illustrated in FIGS. 2B and 2C, the channel layer 209 is disposed on an internal surface of the data storage structure 208 around the perimeter of the vertical opening in pillar 200. The channel layer 209 is between the data storage structure 208 and the first vertical conductor 204. Also, the channel layer 209 is between the data storage structure 208 and the second vertical conductor 205. The channel layer 209 is between the insulating filling layer 211 and the data storage structure 208 in regions around the perimeter of the opening between the first and second vertical conductors 204, 205. In an example, the channel layer 209 is present at least at the levels of the word line layers 104. The channel layer 209 comprises a semiconductor layer such as polysilicon, germanium or silicon/germanium, used for charge transport during operation of the memory cells.

As seen in FIGS. 2B and 2C, the word line layers 104 constitute gates in the memory structure 102. The channel layer 209 has a contact S/D 221a with the first vertical conductor 204 on a first side of the vertical opening in pillar 200, and a contact S/D 221b with the second vertical conductor 205 on a second side of vertical opening in pillar 200. As shown in FIG. 2C, the contacts on opposing sides of the pillar 200 at which the channel layer 209 connects with the first vertical conductor 204 and the second vertical conductor 205 act as source/drain terminals of the memory cell 220.

As shown in FIG. 2C, channel regions are within the channel layer 209 of memory cell 220. The channel regions extend around the perimeter of the vertical opening in pillar 200. Arrows 203 indicate the current flow path within the channel regions between the source/drain terminals (the first vertical conductor 204/the second vertical conductor 205) at the contacts S/D 221a and S/D 221b. Thus, the memory cell 220 has a horizontal channel, perpendicular to a direction of the vertical conductors 204, 205. Memory cells are disposed in a column along the z-direction of the vertical opening of the pillar 200 in this configuration. The memory cells in the same vertical opening of pillar 200 are electrically connected in parallel between the first vertical conductor 204 and the second vertical conductor 205.

Reference is made to FIG. 2C1 for a description of operation of the memory cells. For example, three consecutive memory cells 220a, 220b, 220c are illustrated and labelled in FIG. 2C1, where the three consecutive memory cells 220a, 220b, 220c are coupled in parallel between the vertical conductors 204, 205. Assume that the memory cell 220b is to be read during a read operation. The channel region of the channel layer 209 of the memory cell is horizontal, as discussed with respect to FIG. 2C. A read voltage is applied to the word line layer 104 of the selected memory cell 220b, and the channel regions of the non-selected memory cells 220a, 220c are turned off. Depending on a data stored in the memory cell 220b, current may pass from the vertical conductor 205, via the channel region of the memory cell 220b, to the vertical conductor 204 (path of current illustrated using the thick arrows in the figure), which may then be sensed during the read operation.

Figure 2D:
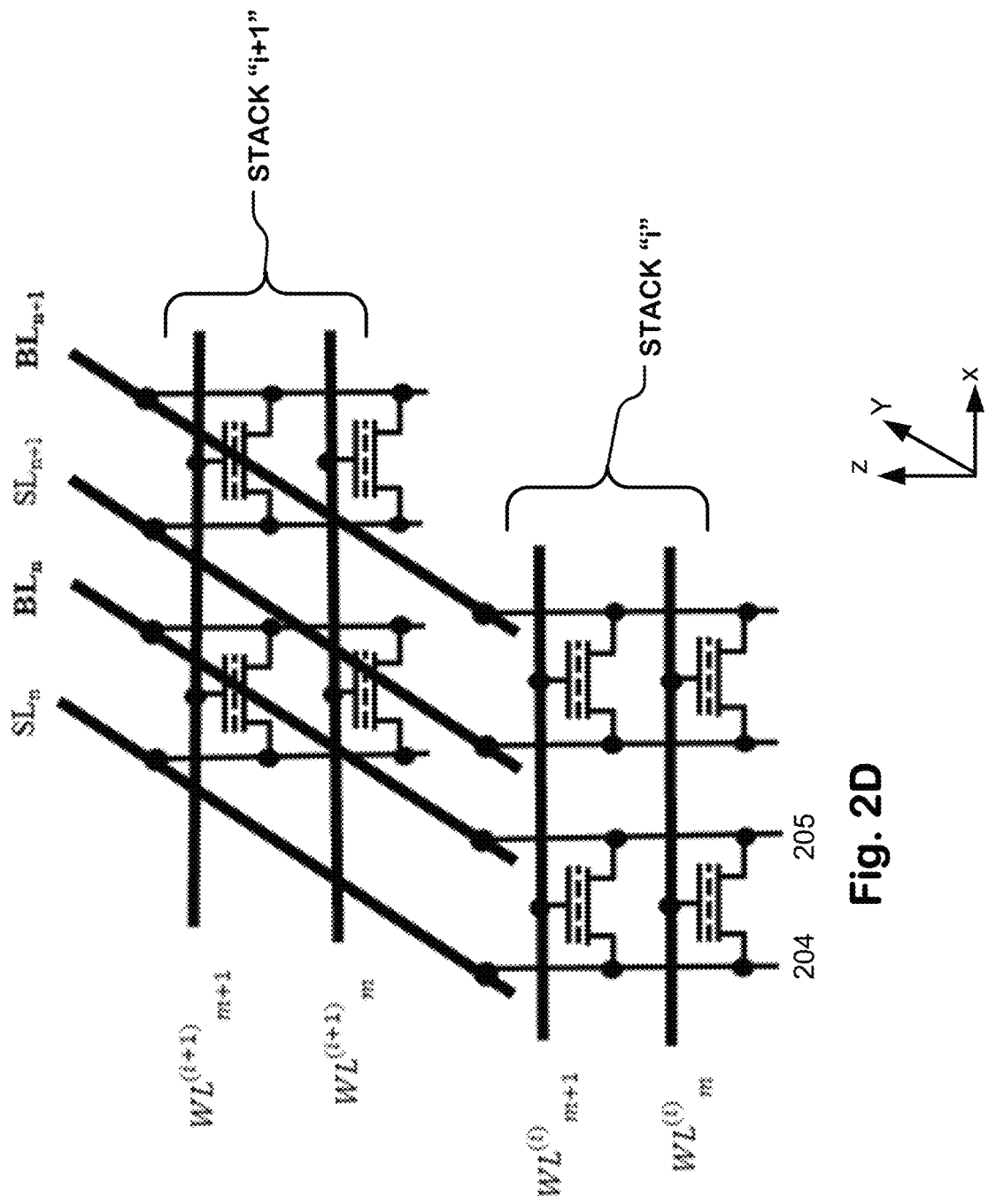
FIG. 2D is a schematic circuit diagram of an array of memory cells implemented as illustrated in FIGS. 2A-2C for a NOR architecture or an AND architecture memory.

FIG. 2D is a circuit diagram of a memory array composed of a memory structure like that of FIGS. 2A to 2C1. A plurality of bit lines (e.g., BLn and BL(n+1)) are disposed over and connected to respective vertical conductors in the memory pillars. The word lines of a first stack "i" are implemented as horizontal conductors penetrated by the memory pillars. The word lines of a second stack "i+1" are implemented as horizontal conductors penetrated by memory pillars. The plurality of bit lines extends in a second direction (Y-direction) orthogonal to a plurality of word lines in the stacks (e.g., WL(i)m and WL(i)(m+1)) in a first X-direction illustrated in FIG. 2D. The first X-direction is also perpendicular to the Z-direction in which the vertical conductors 204, 205 extend. A plurality of source lines extend in the second direction (Y-direction) orthogonal to the plurality of word lines (e.g. WL(i)m and WL(i)(m+1)) in the first direction (X-direction).

The vertical conductors 204, 205 in each memory pillar are coupled to respective ones of the source lines SLn and bit lines BLn, source line SL(n+1) and bit line BL(n+1). At each layer, an individual word line WL (e.g., word line layer 104) is disposed, and penetrated by the plurality of memory pillars. Memory cells are disposed at the cross-points of the word lines and the memory pillars.

For example, a stack of word lines WL(i)m and WL(i)(m+1) are interleaved with alternating insulating layers (not illustrated). A first memory cell is formed at a cross-point of word line WL(i)m, source line SLn and bit line BLn. A second memory cell is formed at a cross-point of word line WL(i)(m+1), source line SLn and bit line BLn. The first and second memory cells are coupled in parallel. A third memory cell is formed at a cross-point of word line WL(i)m, source line SL(n+1) and bit line BL(n+1). A fourth memory cell is formed at a cross-point of word line WL(i)(m+1), source line SL(n+1) and bit line BL(n+1). The third and fourth memory cells are coupled in parallel. Similarly, four memory cells are formed at cross-points of WL(i+1)m and WL(i+1)(m+1), and respective source and bit lines, as illustrated in FIG. 2D.

The under-array circuitry and through-stack via technologies described herein are applicable to memory structures like that described with reference to FIGS. 2A-2D. FIGS. 3-6 illustrate embodiments applied in memory structures like that of FIGS. 2A-2D. However, the under-array circuitry and through-stack via technologies described herein can also be applied to other types of memory structures including, for some examples, vertical NAND structures and cross-point phase change memory structures, and to non-circuits that do not act as memory.

Figure 3:
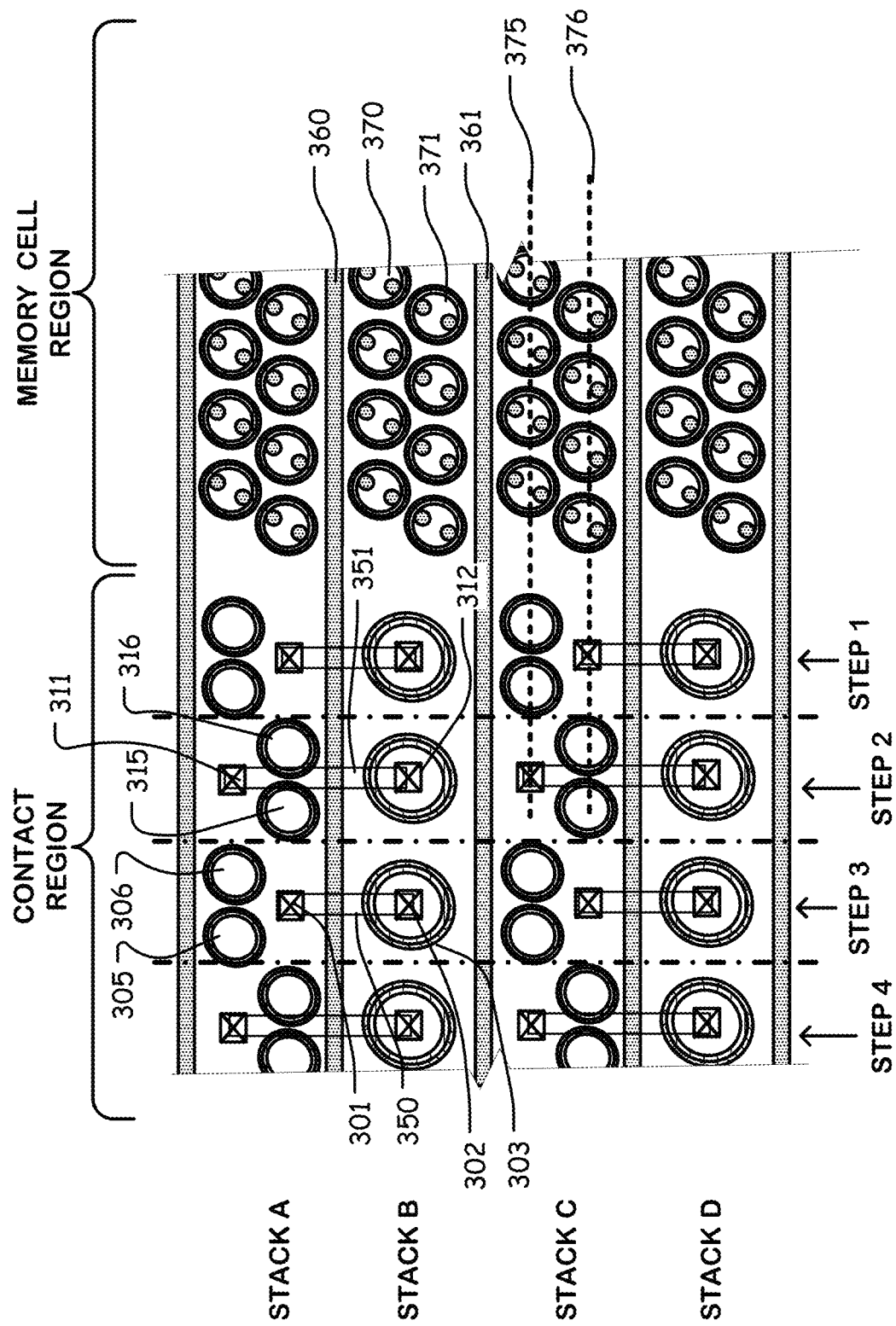
FIG. 3 illustrates, in a layout view, a portion of a memory structure that includes a memory cell region and a stepped region.

FIG. 3 illustrates, in a layout view, a portion of a memory structure that includes a memory cell region and a contact region. The illustrated portion includes four stacks of conductors labeled STACK A to STACK D. The stacks are separated by insulating trenches (e.g. 360, 361). The stacks may be on the order of 900 nm wide, separated by trenches on the order of 150 nm wide.].

In this example, the memory cell region comprises memory pillars like that described above. In the memory cell region of the stacks, there are two rows (e.g. 375, 376 in STACK C) of memory pillars in each stack. The rows of memory pillars are offset in a pattern that allows for more density in the layout of the overlying bit lines and source lines.

The contact region includes a stepped structure, which provides landing areas for each conductive layer configured as a word line in this example. In FIG. 3, four steps are illustrated STEP 1 to STEP 4, although the structure can include N steps, one for each word line layer. The landing areas are the exposed surfaces of the conductive layers in the respective steps.

In STACK A and STACK C, interlayer connectors (e.g. 301, 311 in STACK A) are disposed in each respective step, contacting the landing area of the corresponding conductive layer exposed at the step, and extending to an overlying patterned conductor layer (e.g. 350, 351). In alternating stacks, STACK B and STACK D, through-stack vias (e.g. 303) are disposed through each respective step, and include through-stack conductors (e.g. 302, 312 in STACK B) extending from circuitry below the stack to the overlying patterned conductor layers (e.g. 350, 351).

The memory pillars (e.g. 370, 371) are formed in first vias through the stack having a first layout area. The through-stack vias 303 have a second layout area which is larger than the first layout area. Utilizing a larger second layout area for the through-stack vias provides a greater alignment margin and enlarged etch process window in manufacturing for formation of the through-stack conductors 302, 312 inside the through-stack vias.

In the illustrated layout, the interlayer connectors (e.g. 301, 311) contacting the landing pads on the conductive layers are disposed in two rows that are roughly aligned with the rows of memory pillars in the memory cell region. Thus, the interlayer connector 301 is aligned with the lower row of memory pillars in the same stack, and the interlayer connector 311 is aligned with the upper row of memory pillars in the same stack.

Also, structural pillars (e.g. 305, 306 and STACK A) are disposed through the landing areas on each layer into rows roughly aligned with the rows of memory pillars in the memory cell region, and an opposite pattern with the interlayer connectors 301, 311. Thus, each landing area in STACK A and in STACK C includes an interlayer connector (e.g. 301) and two structural pillars (e.g. 305, 306). The structural pillars 305, 306 can have the same layout area as the memory pillars 370, 371. In the illustrated example, the structural pillars 305, 306 are arranged symmetrically on opposing sides of a line drawn perpendicular to the long axis of the stack from the center of the interlayer connector 301, with the interlayer connector 301 on a first side of the landing area aligned with the lower row of memory pillars, and the structural pillars 315, 316 are arranged symmetrically on opposing sides of a line drawn perpendicular to the long axis of the stack from the center of the interlayer connector 311, with the interlayer connector 311 on a second side of the landing area aligned with the upper row of memory pillars. The symmetry of the layout can contribute to the stability of the structure during a gate replacement process. The technology presented provides a symmetrical layout of structural pillars in landing areas of a stepped contact structure having interlayer conductors as described here, which can be applied independently of, and in combination with, the layout using through-stack vias in adjacent stacks.

In a gate replacement manufacturing technique, the through-stack vias, the vias for the structural pillars 305, 306, and the vias for the memory pillars 370, 371 can be made while the stack comprises alternating sacrificial layers with insulating layers. Also, they can be made in a process that shares masking, etching and filling steps. After the masking, etching and filling steps, the structural pillars 305, 306, and the through-stack via 303 can be filled with material to form a pillar that is isolated from the gate replacement process, and provides structural support during the process. The formation of the interlayer connectors (e.g. 301) and of the through-stack conductors (e.g. 302) in the through-stack vias can be done after refilling of the voids left from removal of the sacrificial material with word line material.

As a result, the through-stack vias, the vias for the structural pillars and the memory pillars provide structural support for the structure after removal of the sacrificial material and refilling the voids in the structure with conductive material. Therefore, the features of the structure described herein independently and in combination can reduce the fragility of the structure during the gate replacement process and improve manufacturing yield.

In the layout illustrated, a first stack of conductors having a memory cell region (or other form of operative region in other embodiments) and a contact region is arranged so that it has a stepped arrangement in the contact region to provide respective landing areas on the conductors. A second stack of conductors is separated from the first stack, and has a memory cell region (or other form of operative region) and a contact region adjacent the contact region of the first stack. Connecting circuits are provided connecting the landing areas of conductive layers in the first stack to through-stack conductors in vias in the contact area of the second stack, in which the through-stack conductors connect to circuitry below the stack.

For additional structural support, the first stack includes structural pillars, and in this case two per landing area which have the same layout area as the memory pillars. The structural pillars do not provide a circuit function, but support the first stack, such as during manufacturing using a gate replacement process.

Figure 4:
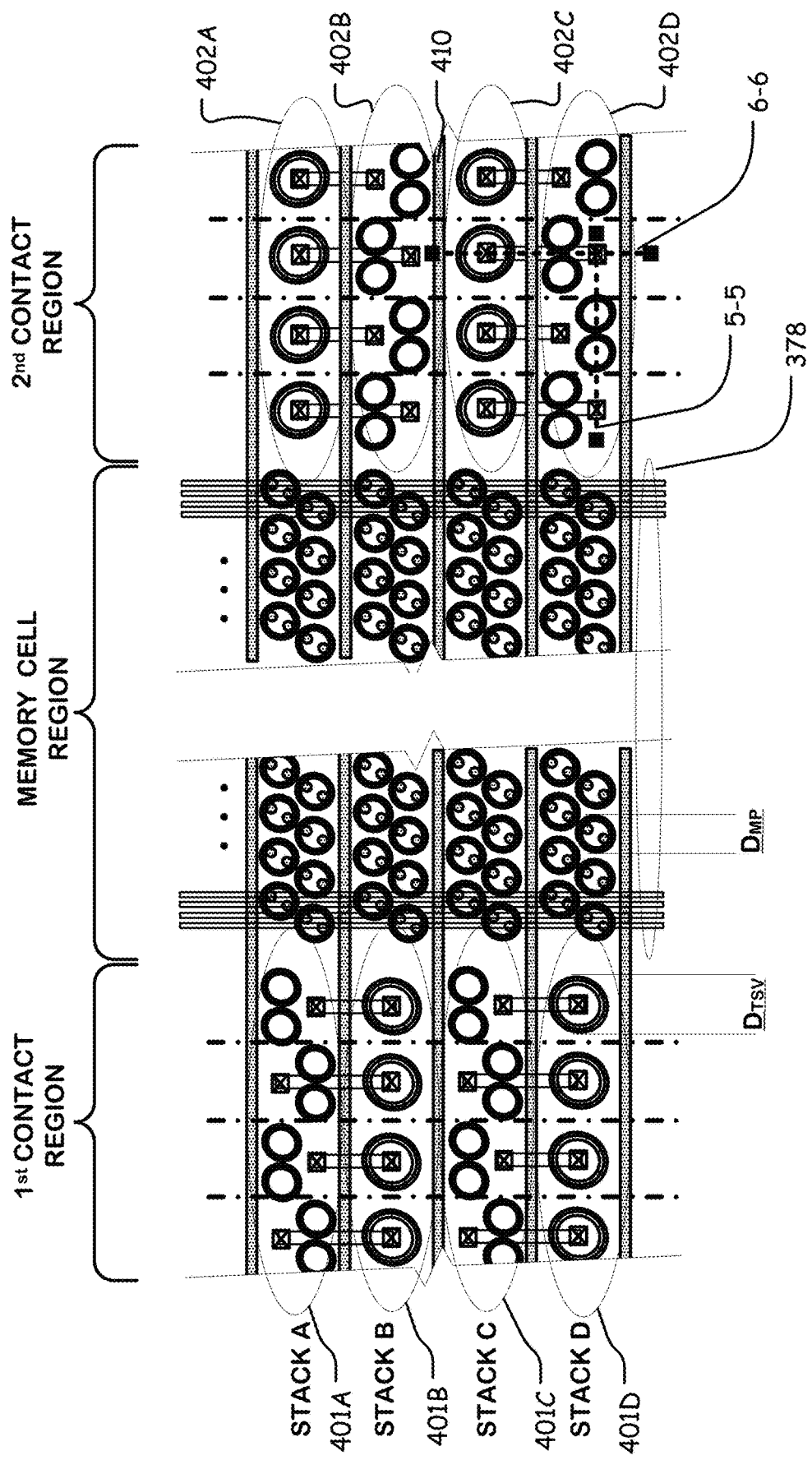
FIG. 4 illustrates an expanded view of the layout of FIG. 3 with first and second contact regions, where the second contact region is complementary to the first contact region.

FIG. 4 illustrates an expanded view of the layout of FIG. 3 with first and second contact regions, where the second contact region is complementary to the first contact region. As seen in FIG. 4, STACK B and STACK D have enlarged through-stack vias and through-stack conductors in the landing areas in the first contact region (see TSV regions 401B and 401D) which serve to connect the interlayer connectors in the contact regions (word line contact regions 401A and 401C) of STACK A and STACK C to the circuitry under the stack. In the second contact region, the layout is complementary so that STACK A and STACK C have enlarged through-stack vias and through-stack conductors in the landing areas in the second contact region (e.g., TSV regions 402A and 402C) which serve to connect the interlayer connectors in the contact regions (word line contact regions 402B and 402D) of STACK B and STACK D to the circuitry under the stack. Also as seen in FIG. 4, high density bit lines 378 overlie the memory cell region and contact the vertical conductors in the memory pillars.

FIG. 4 illustrates that the diameter of the through-stack via $D_{TSV}$ used in the contact regions is greater than the diameter of the memory pillar vias $D_{MP}$. In this example, the diameter $D_{TSV}$ is about twice the diameter $D_{MP}$, and therefore has much greater layout area, providing an enlarged alignment margin and enlarged etch process window as discussed above for formation of the through-stack conductors inside the through-stack vias.

As illustrated in FIG. 4, the word lines of adjacent stacks have outlets to the peripheral circuitry on opposing sides of the array, a two-outlet layout. This two-outlet layout can ease layout constraints for connecting circuits, including the connectors to the through-stack conductors in the adjacent stacks.

Figure 5:
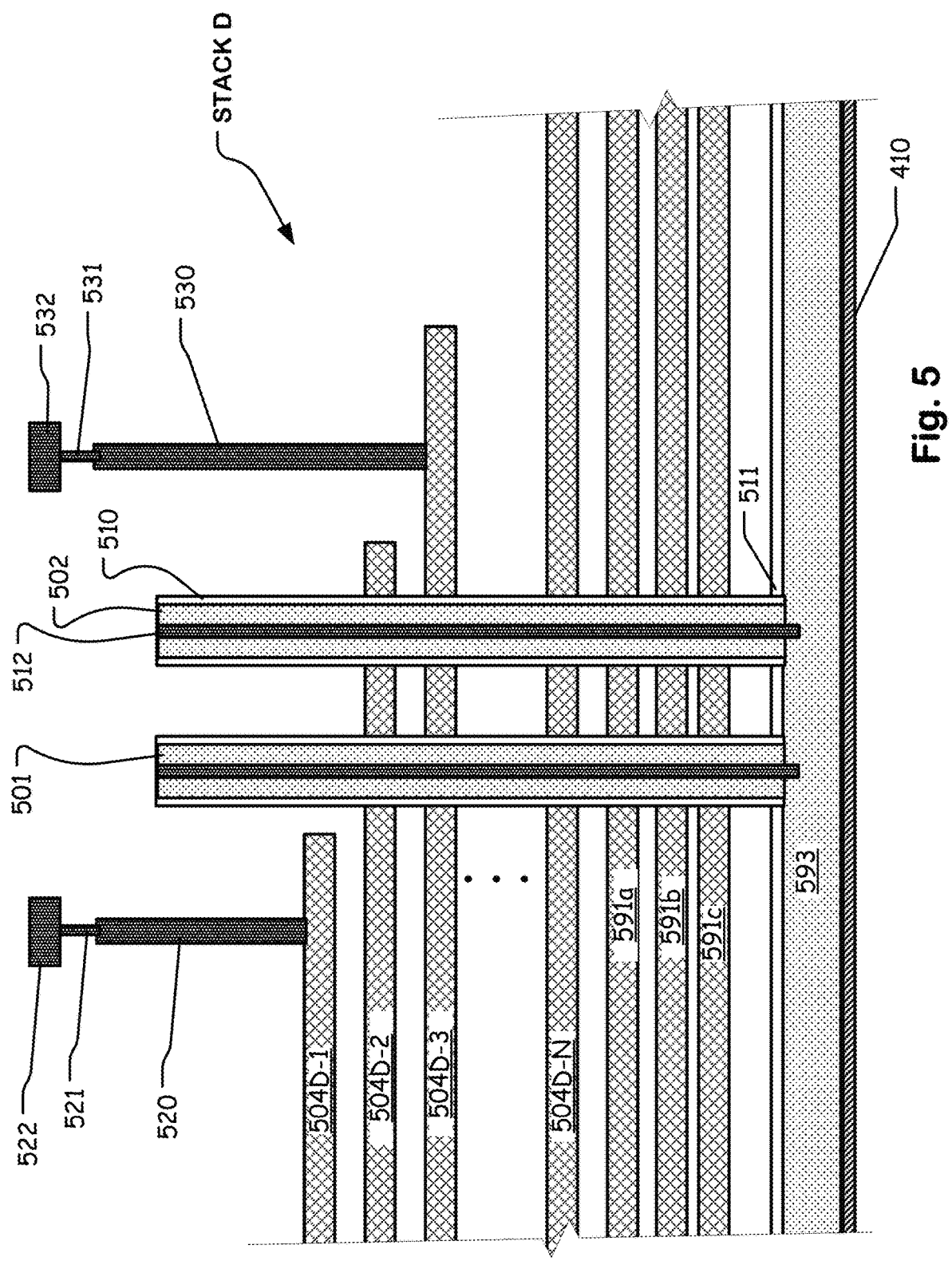
FIG. 5 is a cross-sectional view. of the structure of FIG. 4 taken on line 5-5 (along the second contact region of STACK D).
Figure 6:
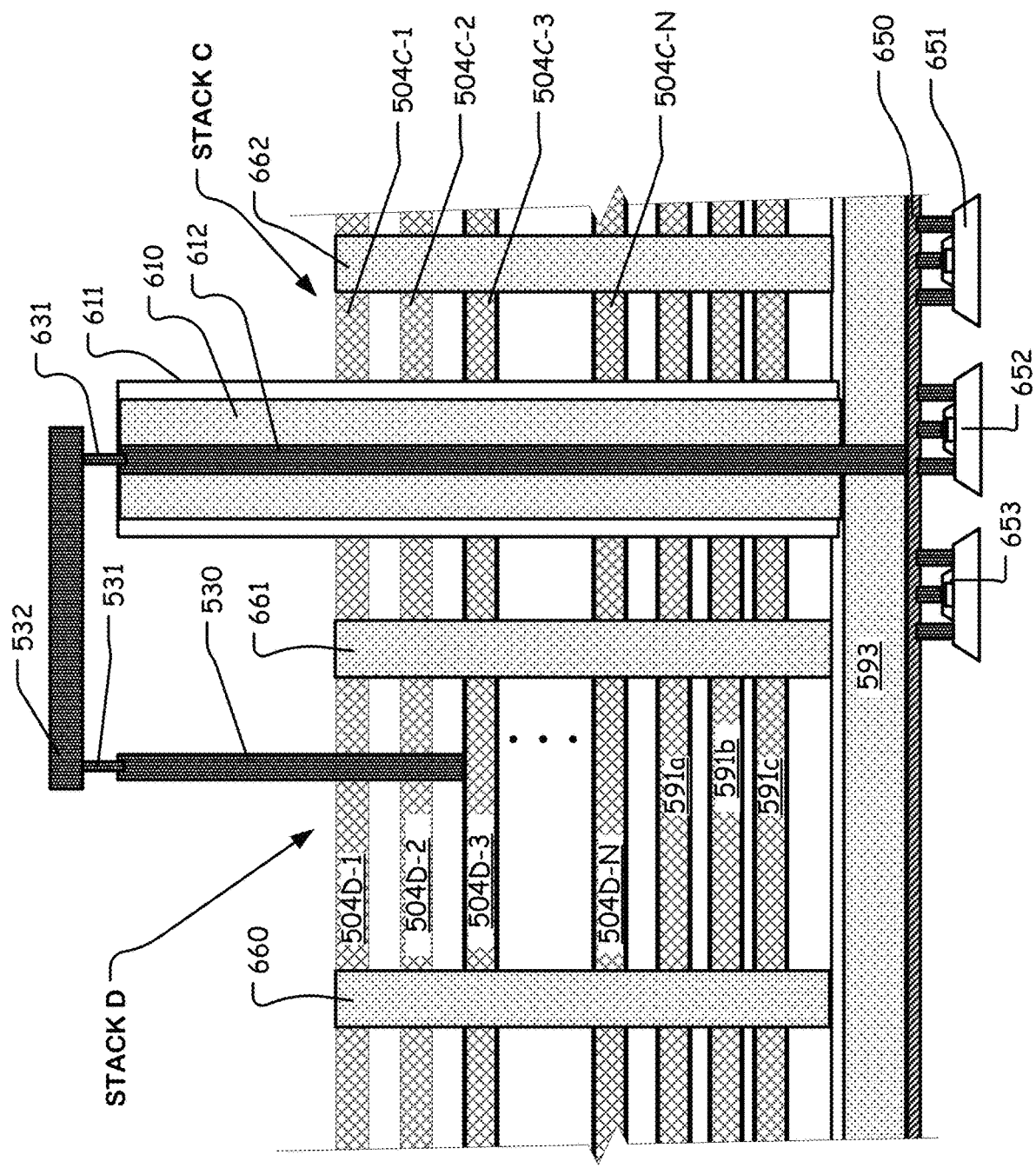
FIG. 6 is a cross-sectional view of the structure of FIG. 4 taken on line 6-6 (across the second contact region of STACK D and the second contact region of STACK C).

FIGS. 5 and 6 are cross-sectional views of the structure of FIG. 4 taken on line 5-5 (second contact region of STACK D) and line 6-6 (between the second contact region of STACK D and the second contact region of STACK C), respectively.

FIG. 5 is a cross-section of part of the contact region of STACK D. The circuit structure includes a plurality of conductive layers 504D-1 to 504D-N configured as word lines in a memory structure like that of FIG. 4. Conductive layers 591a to 591c are disposed under the layers 504D-1 to 504D-N configured as word lines in this example. The underlying insulating layer 593 overlies a patterned conductor layer 410 which is part of the circuitry underlying the stack. There may or may not be active components such as transistors underlying a particular stack in the array in addition to the patterned conductor layer 410. In FIG. 5, a first landing area on a first conductive layer 504D-1 is contacted by an interlayer connector 520, which extends upward to a contact plug 521 and to overlying patterned conductor 522. A second landing area on a third conductive layer 504D-3 is contacted by an interlayer connector 530, which extends upward to a contact plug 531 to overlying patterned conductor 532. In this cross-section, the structural pillars 501 and 502 are disposed through the landing area on the second conductive layer 504D-2, between the landing areas on the first and third conductive layers 504D-1 and 504D-3. The interlayer conductors for the second conductive layer 504D-2 can be provided on an opposite side of the memory region, in the first contact region of this illustration.

The structural pillars 501 and 502 can include a liner 510 formed during manufacturing of the memory pillars, comprising for example a layer of semiconductor material used to form the channel layer in the memory pillar, a layer of memory material used to form the memory material layer in the memory pillar, or both. Also, the structural pillars 501 and 502 can be filled inside the liner 510 so that they form a stable structure during the gate replacement process used in manufacturing of the stack. In this example, a conductive core 512 is illustrated inside the structural pillars 501 and 502, which could be formed during the manufacturing of the memory pillars. However, this conductive core 512 extends into the insulating layer 593 of the circuit structure and does not perform a circuit function. Layer 511 can be material used as an etch stop layer, deposited before formation of the stacks.

FIG. 6 is a cross-section across the second contact region of STACK D and STACK C, with insulating trenches 660, 661, 662 on the sides of the stacks. The conductive layers 504D-1 and 504D-2 are illustrated with lighter borders to represent that they are recessed in this illustration, which shows a cross-section through the landing area on the third conductive layer 504D-3. The interlayer connector 530 extends upward from the landing area on the third conductive layer 504D-3 to the conductive plug 531 and upward to the patterned conductor 532.

Adjacent STACK C includes a plurality of conductive layers 504C-1 to 504C-N. A through-stack via 610 is disposed through the landing area of layer 504C-3. A through-stack conductor 612 is disposed inside the through-stack via 610, and extends from the circuitry below the stack, including patterned conductor layer 650 and transistors or other active components 651. The circuitry under the stack can be used to form peripheral circuitry for the memory array. The through-stack via 610 can be filled with a structure including a liner 611 formed during manufacturing of the memory pillars, comprising for example a layer of semiconductor material used to form the channel layer in the memory pillar, a layer of memory material used to form the memory material layer in the memory pillar, or both. Also, the through-stack via 610 can be filled inside the liner 611 so that it forms a stable structure during manufacturing, such as during a gate replacement process used in manufacturing of the stack. A conductive core provides the vertical through-stack conductor 612 inside the through-stack via 610, which could be formed after the gate replacement process inside the enlarged through-stack via, taking advantage of the greater alignment and etch process windows. The through-stack conductor 612 is connected by a conductive plug 631 to the patterned conductor 532, connecting the word line 504D-3 to the under stack circuitry (650, 651, 652, 653).

Figure 7:
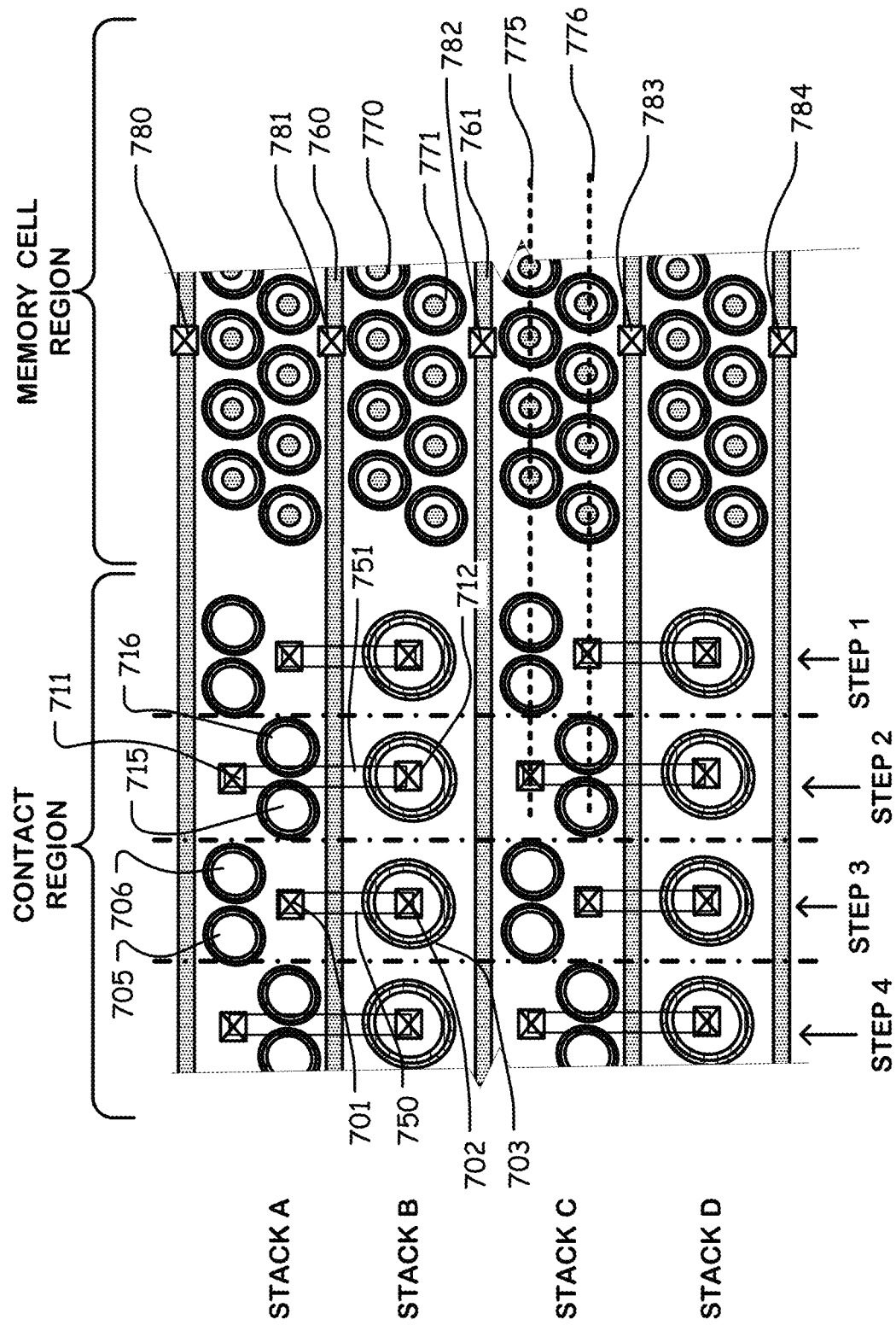
FIG. 7 illustrates, in a layout view, a portion of a memory structure that includes a memory cell region, including vertical NAND strings, and a stepped region.

FIG. 7 illustrates, in a layout view in the form of FIG. 3, a portion of an alternate memory structure that includes a NAND memory operative region. Thus as illustrated, the structuring comprises a memory cell region having vertical NAND strings, and a contact region. The illustrated portion includes four stacks of conductors labeled STACK A to STACK D. The stacks are separated by insulating trenches (e.g. 760, 761).

In this example, the memory cell region comprises memory pillars configured to act as NAND strings, one example of which is described in U.S. Pat. No. 10,644,018, 3D MEMORY HAVING PLURAL LOWER SELECT GATES, by Lee et al., issued May 5, 2020, which incorporated by reference as if fully set forth herein. In the illustrated NAND string structure, the memory pillars comprise a vertical channel, and a contact is made to the vertical channel of each pillar to be connected to a bit line. As in the example of FIG. 3, in the memory cell region of the stacks, there are two rows (e.g. 775, 776 in STACK C) of memory pillars in each stack. The rows of memory pillars are offset in a pattern that allows for more density in the layout of the overlying bit lines and source lines.

The contact region includes a stepped structure, which provides landing areas for each conductive layer configured as a word line in this example. In FIG. 7, four steps are illustrated STEP 1 to STEP 4, although the structure can include N steps, one for each word line layer. The landing areas are the exposed surfaces of the conductive layers in the respective steps.

In STACK A and STACK C, interlayer connectors (e.g. 701, 711 in STACK A) are disposed in each respective step, contacting the landing area of the corresponding conductive layer exposed at the step, and extending to an overlying patterned conductor layer (e.g. 750, 751). In alternating stacks, STACK B and STACK D, through-stack vias (e.g. 703) are disposed through each respective step, and include through-stack conductors (e.g. 702, 712 in STACK B) extending from circuitry below the stack to the overlying patterned conductor layers (e.g. 750, 751). In the illustrated NAND structure, interlayer conductors 780, 781, 782, 783 and 784 are disposed in vias located in the slits between the stacks, and connect to an underlying common source line for the NAND circuits.

The memory pillars (e.g. 770, 771) are formed in first vias through the stack having a first layout area. The through-stack vias 703 have a second layout area which is larger than the first layout area. Utilizing a larger second layout area for the through-stack vias provides a greater alignment margin and enlarged etch process window in manufacturing for formation of the through-stack conductors 702, 712 inside the through-stack vias.

In the illustrated layout, the interlayer connectors (e.g. 701, 711) contacting the landing pads on the conductive layers are disposed in two rows that are roughly aligned with the rows of memory pillars in the memory cell region. Thus, the interlayer connector 701 is aligned with the lower row of memory pillars in the same stack, and the interlayer connector 711 is aligned with the upper row of memory pillars in the same stack.

Also, structural pillars (e.g. 705, 706 and STACK A) are disposed through the landing areas on each layer into rows roughly aligned with the rows of memory pillars in the memory cell region, and an opposite pattern with the interlayer connectors 701, 711. Thus, each landing area in STACK A and in STACK C includes an interlayer connector (e.g. 701) and two structural pillars (e.g. 705, 706). The structural pillars 705, 706 can have the same layout area as the memory pillars 770, 771. In the illustrated example, the structural pillars 705, 706 are arranged symmetrically on opposing sides of a line drawn perpendicular to the long axis of the stack from the center of the interlayer connector 701, with the interlayer connector 701 on a first side of the landing area aligned with the lower row of memory pillars, and the structural pillars 715, 716 are arranged symmetrically on opposing sides of a line drawn perpendicular to the long axis of the stack from the center of the interlayer connector 711, with the interlayer connector 711 on a second side of the landing area aligned with the upper row of memory pillars. The symmetry of the layout can contribute to the stability of the structure during a gate replacement process. The technology presented provides a symmetrical layout of structural pillars in landing areas of a stepped contact structure having interlayer conductors as described here, which can be applied independently of, and in combination with, the layout using through-stack vias in adjacent stacks.

In a gate replacement manufacturing technique, the through-stack vias, the vias for the structural pillars 705, 706, vias for the interlayer conductors 780-784, and the vias for the memory pillars 770, 771 can be made while the stack comprises alternating sacrificial layers with insulating layers. Also, they can be made in a process that shares masking, etching and filling steps. After the masking, etching and filling steps, the structural pillars 705, 706, and the through-stack via 703 can be filled with material to form a pillar that is isolated from the gate replacement process, and provides structural support during the process. The formation of the interlayer connectors (e.g. 701) and of the through-stack conductors (e.g. 702) in the through-stack vias can be done after refilling of the voids left from removal of the sacrificial material with word line material.

As a result, the through-stack vias, the vias for the structural pillars and the memory pillars provide structural support for the structure after removal of the sacrificial material and refilling the voids in the structure with conductive material. Therefore, the features of the structure described herein independently and in combination can reduce the fragility of the structure during the gate replacement process and improve manufacturing yield.

In the layout illustrated, a first stack of conductors having a memory cell region (or other form of operative region in other embodiments) and a contact region is arranged so that it has a stepped arrangement in the contact region to provide respective landing areas on the conductors. A second stack of conductors is separated from the first stack, and has a memory cell region (or other form of operative region) and a contact region adjacent the contact region of the first stack. Connecting circuits are provided connecting the landing areas of conductive layers in the first stack to through-stack conductors in vias in the contact area of the second stack, in which the through-stack conductors connect to circuitry below the stack.

For additional structural support, the first stack includes structural pillars, and in this case two per landing area which have the same layout area as the memory pillars. The structural pillars do not provide a circuit function, but support the first stack, such as during manufacturing using a gate replacement process.

A technology is presented that provides circuit structures which improve the manufacturing yield of complex circuits, such as 3D memory. The circuit structure can improve the stability during gate replacement manufacturing processes for example. It can prevent, in a structure like that of FIG. 4, the tilting of the STACKS A to D after removal of sacrificial material used in the manufacturing sequence. The technology provides a bridge for connecting a conductor such as word lines in a stepped contact region of a 3D structure to through-stack vias for connection to circuitry under the stacks. The circuit structure includes enlarged through-stack vias which improve the etch process window and alignment window during manufacturing. The circuit structure includes an alternating layout of interlayer connectors contacting the landing pads and through-stack connectors in adjacent stacks of conductors. This approach improves the layout arrangement and density of overlying conductors required in circuits of this type.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A circuit structure, comprising:
a first stack of conductors having an operative region and a contact region, conductors of the first stack having a stepped arrangement in the contact region to provide respective landing areas on the conductors;
a second stack of conductors separated from the first stack, the second stack having an operative region and a contact region adjacent the contact region of the first stack;
connecting circuits connect the landing areas of conductive layers in the first stack to a plurality of through-stack conductors in vias in the contact region of the second stack, the through-stack conductors connecting to circuitry below the second stack; and
a first array of vertical pillars through the operative region of the first stack and a second array of vertical pillars through the operative region of the second stack,
wherein the connecting circuits include a plurality of interlayer connectors in the contact region of the first stack, interlayer connectors in the plurality of interlayer connectors contacting respective landing areas on conductors in the first stack, and extending to patterned conductors over the first and second stacks, and
wherein the patterned conductors include a connection from interlayer connectors in the plurality of interlayer connectors in the contact region of the first stack to the plurality of through-stack conductors in the contact region of the second stack.

2. The circuit structure of claim 1, including a plurality of structural pillars in the contact region of the first stack.

3. The circuit structure of claim 2, wherein the structural pillars in the plurality of structural pillars are disposed in vias having a first layout area, and through-stack conductors in the plurality of through-stack conductors are disposed in vias having a second layout area, the second layout area being larger than the first layout area.

4. The circuit structure of claim 1, including two structural pillars in respective vias through the first stack in the landing area of a particular conductor in the first stack.

5. A circuit structure, comprising:
a first stack of conductors having an operative region and a contact region, conductors of the first stack having a stepped arrangement in the contact region to provide respective landing areas on the conductors;
a second stack of conductors separated from the first stack, the second stack having an operative region and a contact region adjacent the contact region of the first stack;
a first array of vertical pillars through the operative region of the first stack and a second array of vertical pillars through the operative region of the second stack, the vertical pillars in the first and second arrays comprising memory structures in first vias having a first layout area;
a plurality of interlayer connectors in the contact region of the first stack, interlayer connectors in the plurality of interlayer connectors contacting respective landing areas on conductors in the first stack, and extending to patterned conductors over the first and second stacks;
a plurality of through-stack conductors in the contact region of the second stack, the through-stack conductors extending from the patterned conductors over the first and second stacks to a circuit under the second stack; and
the patterned conductors including a connection from interlayer connectors in the plurality of interlayer connectors in the contact region of the first stack to through-stack conductors in the plurality of through-stack conductors in the contact region of the second stack.

6. The circuit structure of claim 5, including a plurality of structural pillars in the contact region of the first stack disposed in second vias having the first layout area.

7. The circuit structure of claim 5, wherein the through-stack conductors in the plurality of through-stack conductors are disposed in third vias having a second layout area, the second layout area being larger than the first layout area.

8. The circuit structure of claim 5, wherein the second stack has a second contact region on a second side of the operative region of the second stack, conductors of the second stack having a stepped arrangement in the second contact region to provide respective landing areas on the conductors; and the first stack has a second contact region on a second side of the operative region of the first stack, the second contact region of the first stack adjacent the second contact region of the second stack;
a second plurality of interlayer connectors in the second contact region of the second stack, interlayer connectors in the second plurality of interlayer connectors contacting respective landing areas on conductors in the second stack, and extending to patterned conductors over the first and second stacks;
a plurality of through-stack conductors in the second contact region of the first stack, the through-stack conductors extending from the patterned conductors over the first and second stacks to a circuit under the first stack; and
the patterned conductors including a connection from interlayer connectors in the plurality of interlayer connectors in the second contact region of the second stack to through-stack conductors in the plurality of through-stack conductors in the contact region of the first stack.

9. The circuit structure of claim 5, including two structural pillars in respective second vias through the first stack in the landing area of a particular conductor in the first stack, the second vias having the first layout area.

10. The circuit structure of claim 5, wherein the memory structures in the first and second arrays of vertical pillars respectively comprise first and second vertical conductors and channel structures between the first and second vertical conductors to form memory cells with the conductors in the first and second stacks configured as word lines.

11. The circuit structure of claim 5, wherein the memory structures in the first and second arrays of vertical pillars respectively comprise first and second vertical NAND strings to form memory cells with the conductors in the first and second stacks configured as word lines.

12. A memory circuit structure, comprising:
a first stack of conductors having a memory region and a first word line contact region, conductors of the first stack including word line conductors having a stepped arrangement in the first word line contact region to provide respective landing areas on the conductors;
a second stack of conductors separated from the first stack, the second stack having a memory region and a second through-stack contact region adjacent the first word line contact region of the first stack, and conductors of the second stack including word line conductors;

a first array of vertical pillars through the memory region of the first stack and a second array of vertical pillars through the memory region of the second stack, the vertical pillars in the first and second arrays comprising memory structures in first vias having a first layout area;

a plurality of interlayer connectors in the first word line contact region of the first stack, interlayer connectors in the plurality of interlayer connectors contacting respective landing areas on word lines in the first stack, and extending to patterned conductors over the first and second stacks;

a plurality of through-stack conductors in the second through-stack contact region of the second stack, the through-stack conductors extending from the patterned conductors over the first and second stacks to a circuit under the second stack; and the patterned conductors including a connection from interlayer connectors in the plurality of interlayer connectors in the first word line contact region of the first stack to through-stack conductors in the plurality of through-stack conductors in the second through-stack contact region of the second stack.

13. The memory circuit structure of claim 12, including a plurality of structural pillars in the first word line contact region of the first stack disposed in second vias having the first layout area.

14. The memory circuit structure of claim 12, wherein the through-stack conductors in the plurality of through-stack conductors in the second through-stack contact region are disposed in third vias having a second layout area, the second layout area being larger than the first layout area.

15. The memory circuit structure of claim 12,
wherein the second stack has a second word line contact region on a second side of the memory region of the second stack, conductors of the second stack having a stepped arrangement in the second word line contact region to provide respective landing areas on the conductors; and the first stack has a first through-stack contact region on a second side of the memory region of the first stack, the second through-stack contact region of the first stack adjacent the second word line contact region of the second stack, wherein the memory circuit structure includes a second plurality of interlayer connectors in the second word line contact region of the second stack, interlayer connectors in the second plurality of interlayer connectors contacting respective landing areas on conductors in the second stack, and extending to patterned conductors over the first and second stacks, wherein the memory circuit structure includes a plurality of through-stack conductors in the first through-stack contact region of the first stack, the through-stack conductors extending from the patterned conductors over the first and second stacks to a circuit under the first stack, and wherein the patterned conductors include a connection from interlayer connectors in the plurality of interlayer connectors in the second word line contact region of the second stack to through-stack conductors in the plurality of through-stack conductors in the first through-stack contact region of the first stack.

16. The memory circuit structure of claim 12, including two structural pillars in respective second vias through the first stack in the landing area of a particular conductor in the first stack, the second vias having the first layout area.

17. The memory circuit structure of claim 12, wherein the memory structures in the first and second arrays of vertical pillars respectively comprise first and second vertical conductors and structures between the first and second vertical conductors to form memory cells with the conductors in the first and second stacks configured as word lines.

18. The memory circuit structure of claim 12, wherein the memory structures in the first and second arrays of vertical pillars respectively comprise first and second vertical NAND strings to form memory cells with the conductors in the first and second stacks configured as word lines.

19. The circuit structure of claim 1, further including an insulating trench separating the first stack from the second stack.

* * * * *